(12) United States Patent
Pfannenberg (10) Patent No.: US 6,817,940 B2
(45) Date of Patent: Nov. 16, 2004

(54) AIRFLOW UNIT (75) Inventor: Andreas Pfannenberg, Hamburg (DE)

(73) Assignee: Pfannenberg GmbH, Hamburg (DE)

( * ) Notice: Subject to any disclaimer, the term of this patent is extended or adjusted under 35 U.S.C. 154(b) by 0 days.

(21) Appl. No.: 10/454,827

(22) Filed: Jun. 3, 2003

(65) Prior Publication Data

US 2004/0077304 A1 Apr. 22, 2004

(30) Foreign Application Priority Data

| Jun. 3, 2002 | (DE) | 202 06 609 U |
| May 30, 2003 | (EP) | 03012410 |
| May 28, 2003 | (DE) | 203 08 482 U |

(51) Int. Cl.⁷ .............................................. H05K 5/00
(52) U.S. Cl. ........................ 454/184; 361/694; 361/695
(58) Field of Search ............... 454/184; 174/35 R, 174/35 GC; 361/693, 695, 694

(56) References Cited

U.S. PATENT DOCUMENTS

| 3,853,475 | A | * | 12/1974 | Gordon et al. | ................ | 96/134 |
| 3,973,477 | A | * | 8/1976 | Jakob et al. | ................ | 454/184 |
| 4,776,737 | A | * | 10/1988 | Wollar | ................ | 411/38 |
| 5,984,709 | A | * | 11/1999 | Zink et al. | ................ | 439/348 |
| 6,297,446 | B1 | * | 10/2001 | Cherniski et al. | ......... | 174/35 R |
| 6,610,922 | B1 | * | 8/2003 | Twiss et al. | ........... | 174/35 MS |
| 6,710,241 | B2 | * | 3/2004 | Casper | ................ | 174/35 MS |

* cited by examiner

Primary Examiner—Derek S. Boles
(74) Attorney, Agent, or Firm—Friedrich Kueffner (57) ABSTRACT An airflow unit, especially a filter fan or discharge filter with or without a tan for installation in an installation opening in a wall, especially a housing for components that produce waste heat, includes a ventilation grating composed of a frame holding a filter medium, a support member with a frame having a peripheral wall surface which expands outwardly, wherein the support member is provided with airflow openings and with water-diverting wings or rib formations. A shielding grating is inserted in the support member on a side facing away from the ventilation grating. An IP seal is foamed onto the support member for protection against splash water and spray water. All components of the airflow unit are held together by clamp or screw connections. The airflow unit is placed on the outer wall surface of the wall of the housing and is preferably detachably connected with the housing wall.

14 Claims, 13 Drawing Sheets

AIRFLOW UNIT

BACKGROUND OF THE INVENTION

1. Field of the Invention

The invention concerns an airflow unit, especially a filter fan or discharge filter with or without a fan for installation in an installation opening in a wall, especially a housing for components that produce waste heat, such as a switch cabinet, electronics cabinet, computer system, or the like.

2. Description of the Related Art

When a housing contains components that produce a sufficiently large amount of waste heat, it is necessary to eliminate the waste heat from the housing and to control the temperature in the housing by blowing or drawing a suitable amount of ambient air into the interior of the housing by means of the fan. Computer housings are a well-known example of this. Housings of this type are usually equipped with a filter fan, which either runs continuously or is switched on and off by a control unit as a function of the temperature in the housing. The filter fan is installed in a recess of a wall of the housing and is secured, for example, by screw connections. At the same time, corresponding air discharge slits are provided elsewhere on the housing to allow the air to be discharged. However, the installation of filter fans of this type is often laborious, since, when screw connections are used, hardly any clearance is available even for subsequent visual alignment of the filter fan.

SUMMARY OF THE INVENTION

The object of the present invention is to develop an airflow unit as a filter fan or discharge filter of the type described above with an improved shielding effect with high operational security of an electrically conductive connection between an EMC shielding plate and an installation opening of a switch cabinet and in regard to EMC stability in conjunction with high IP protection. In addition, opening compatibility with known, previously used filter fans and simple, cost-effective installation and production should be achieved.

This objective is achieved with an airflow unit of the type described at the beginning, which comprises a ventilation grating, which consists of a frame with a front plate provided with strips and/or air slits and a neck-like recessed insert, such that the frame holds a filter medium, a support member, which consists of a frame with a peripheral wall surface that preferably expands outwardly like a wedge and with an interior space for holding the neck-like recessed insert of the ventilation grating, such that the support member, on its side facing away from the ventilation grating, is provided with airflow openings and with water-diverting fins or rib formations for draining splash water and condensation water that have penetrated the unit and serves to hold the neck-like recessed insert of the ventilation grating, a shielding grating with an EMC seal for EMC damping, which is inserted in the support member on the side facing away from the ventilation grating and is held on the support member by means of screw, rivet, adhesive, or clamp connections, and and an IP seal foamed onto the support member for protection against splash water and spray water, such that all components of the airflow unit are held together by clamp or screw connections, and such that, to install the airflow unit in the region of the installation opening in the wall surface of the housing, the airflow unit is placed on the outer wall surface of the wall of the housing and is preferably detachably connected with the housing wall.

This airflow unit is simple to produce and easy to install. A very good shielding effect with respect to EMC stability is achieved, together with high IP protection. Without a fan, the airflow unit can be used, for example, as an air discharge filter in switch cabinets. With a fan, the airflow unit is used as a filter fan, especially in housings that contain components that generate waste heat. In this regard, the fan can be premounted on the components of the airflow unit. The fan may be used for air suction or air exhaust. The complete unit is then installed on the wall of the cabinet from the outside, and the opening in the cabinet wall must be dimensioned in such a way that the fan can be pushed through it.

A chamfered outer wall surface of the support member produces the advantage that splash water drains easily. In addition, the chamfered outer wall surface makes it possible to countersink fastening screws, since recesses are formed in the peripheral regions.

Figure 2:
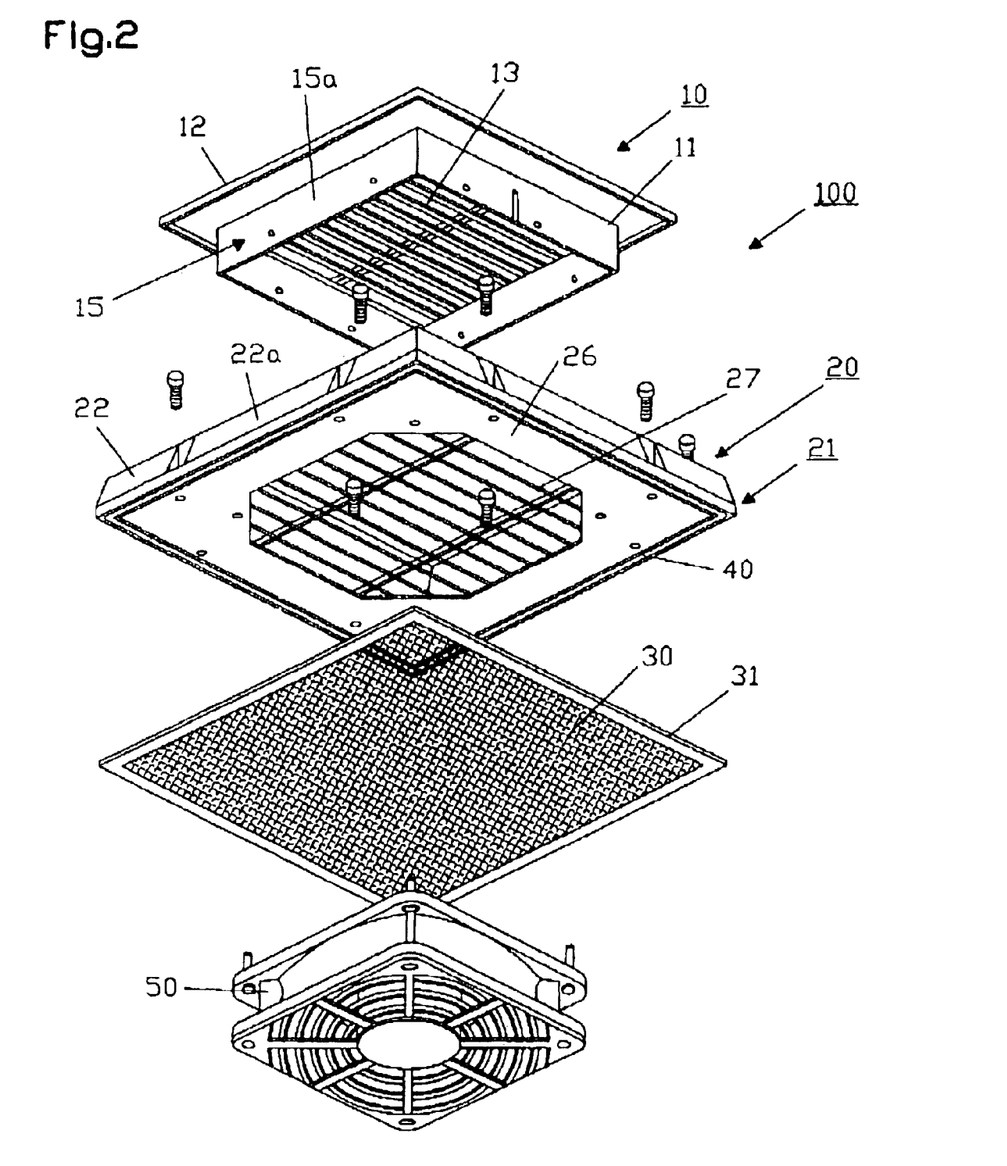
FIG. 2 shows a graphic exploded view of the airflow unit in accordance with FIG. 1 with the components spread apart.

A second embodiment of a airflow unit of the invention in accordance with FIG. 2 comprises a design cover, which consists of a frame with a front plate provided with strips and/or air slits and with a neck-like recessed insert, a space-filling filter medium, which is inserted in the space bounded by the frame, a base housing, which consists of a frame with a peripheral sidewall and with an interior space for holding the neck-like recessed insert of the design cover, such that the base housing is provided with airflow openings on its side that faces away from the design cover and that forms the rear wall and with a peripheral seal on its side facing the design cover and has at least two locking corners.

an EMC shielding plate, which consists of a metal frame with a peripheral sidewall, whose corner regions have recesses for the locking corners of the base housing, and with a rear wall designed as a shielding grating, such that the lateral edges of the peripheral sidewall of the metal frame which face the base housing have a number of spring contact tongues for producing an electrically conductive connection between the EMC shielding plate and the installation opening of a switch cabinet, which spring contact tongues have end sections that are laterally turned out from the plane formed by the peripheral sidewall of the metal frame, such that the contact tongues are fastened to the metal frame or are cut out of the peripheral sidewall of the metal frame, such that all of the components of the airflow unit are held together by clamping, riveting or screw connections, and such that, to install the airflow unit in the area of the installation opening, the sidewalls of the base housing of the airflow unit are placed on the outside wall surface of the wall of the housing and preferably detachably connected with it.

An airflow unit designed in this way is simple to produce and easy to install. A very good shielding effect is achieved in regard to EMC stability in conjunction. Without a fan, the airflow unit can be used, for example, as an air discharge filter in switch cabinets. With a fan, the airflow unit is used as a filter fan, especially in housings that contain components that generate waste heat. In this regard, the fan can be premounted on the components of the airflow unit. The fan may be used for air suction or air exhaust. The complete unit is then installed on the wall of the cabinet from the outside, and the opening in the cabinet wall must be dimensioned in such a way that the fan can be pushed through it.

Due to the special design of the EMC shielding plate of the peripheral sidewall of the frame that forms the EMC shielding plate, an excellent shielding effect is guaranteed, since a good electrically conductive connection is created between the EMC shielding plate and the installation cutout of the switch cabinet. Even if the dimensions of the installation cutout deviate from the dimensions of the airflow unit, good contact is ensured, since the spring contact tongues adapt to differences in dimensions.

In addition, a high degree of IP protection is achieved with the airflow unit of the invention; cost-effective manufacture and installation is also assured, as is good contacting of the spring contact tongues with the installation wall of the switch cabinet. Due to the large number of contact tongues provided on the EMC shielding plate, which are arranged in the form of strips, contact with the metal surfaces of the switch cabinet is always guaranteed.

When the airflow unit is used with a fan, a fan housing with a fan and possibly with a protective safety grille on the outside is joined with the design cover, the base housing, and the EMC shielding plate.

The components of the airflow unit are mounted on the wall of the design cover from the outside by screws or fastening devices of a different design.

Except for the EMC shielding plate, all of the components of the airflow unit are made of a plastic.

In accordance with another refinement of the invention, to be able to use fans of different sizes in the airflow unit, an adapter-like fan support is installed between the fan housing with the fan and the other components of the airflow unit for mounting fan housings with larger or smaller dimensions relative to the components of the airflow unit.

Another advantage is achieved with a refinement of the airflow unit, in which the shielding grating of the EMC shielding plate is provided with surfaces running at an inclination from the peripheral edge of the shielding grating to its center to form a concavity, so that a hollowed, depressed area is formed in the center of the shielding grating. This makes it possible to produce airflow assemblies with a compact design and in small dimensions, since, for example, the hub of the fan or parts of the fan come to rest in the depression formed in the shielding grating.

Additional advantageous refinements of the unit of the invention are the objects of the dependent claims.

The invention is explained in greater detail below with reference to the embodiments illustrated in the attached drawings.

DESCRIPTION OF THE PREFERRED EMBODIMENTS

Figure 3:
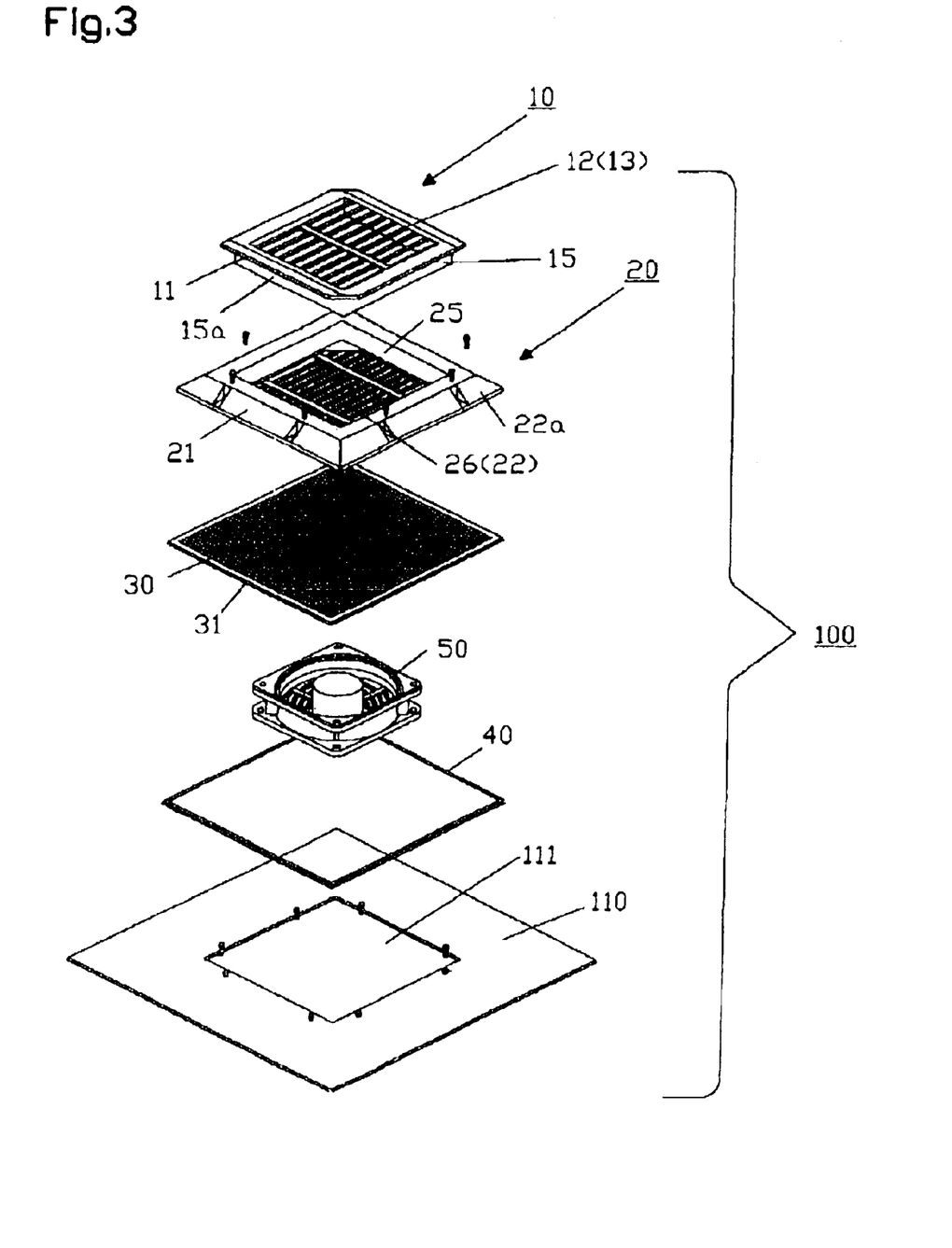
FIG. 3 shows a graphic exploded view of the airflow unit in accordance with FIG. 1 with a section of a switch cabinet wall with an installation opening.
Figure 4:
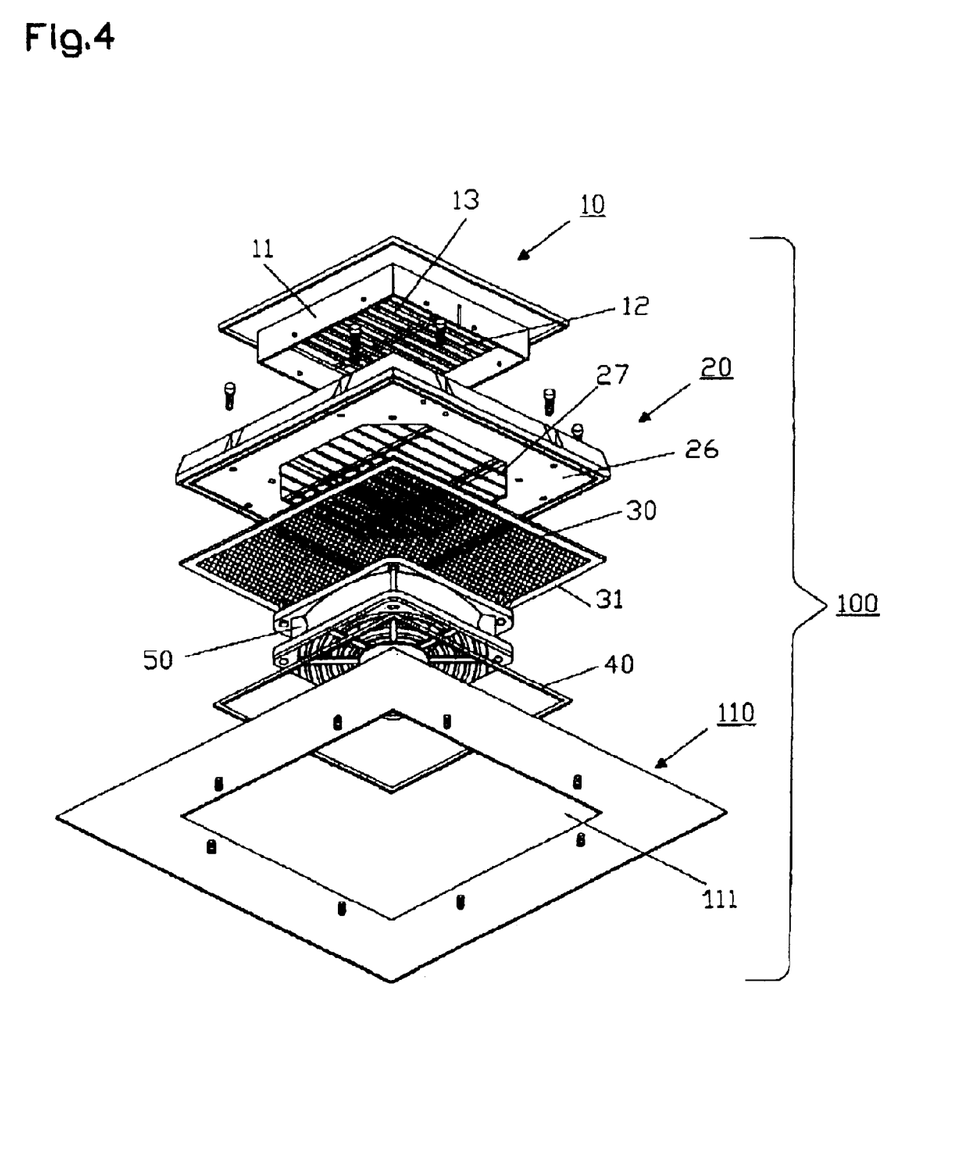
FIG. 4 shows a graphic exploded view of the airflow unit in accordance with FIG. 3 from below.
Figure 5:
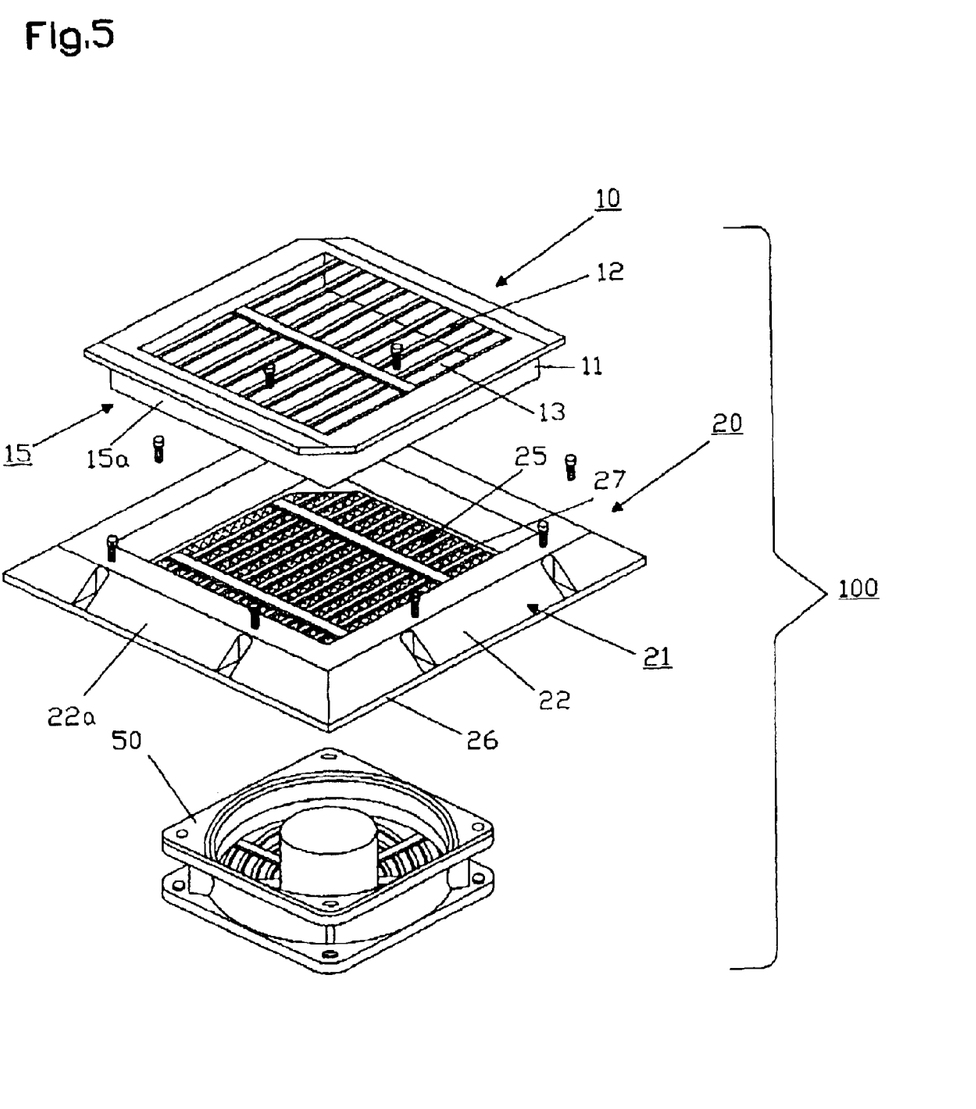
FIG. 5 shows a graphic exploded view of the airflow unit with the support member, the shielding grating installed in it, the ventilation grating lifted off, and the fan.
Figure 6:
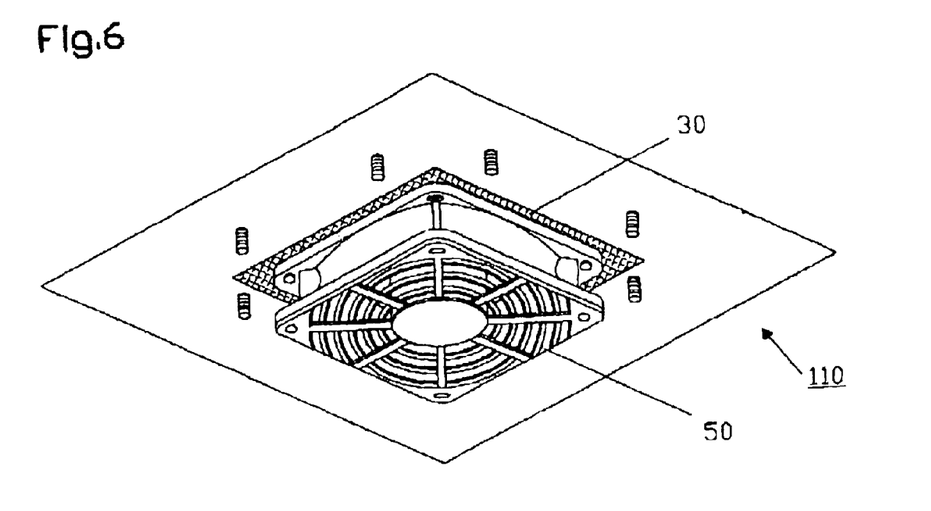
FIG. 6 shows a graphic view of a section of a switch cabinet wall with the fan arranged in the region of the installation opening and with the shielding grating arranged between the switch cabinet wall and the fan.
Figure 9:
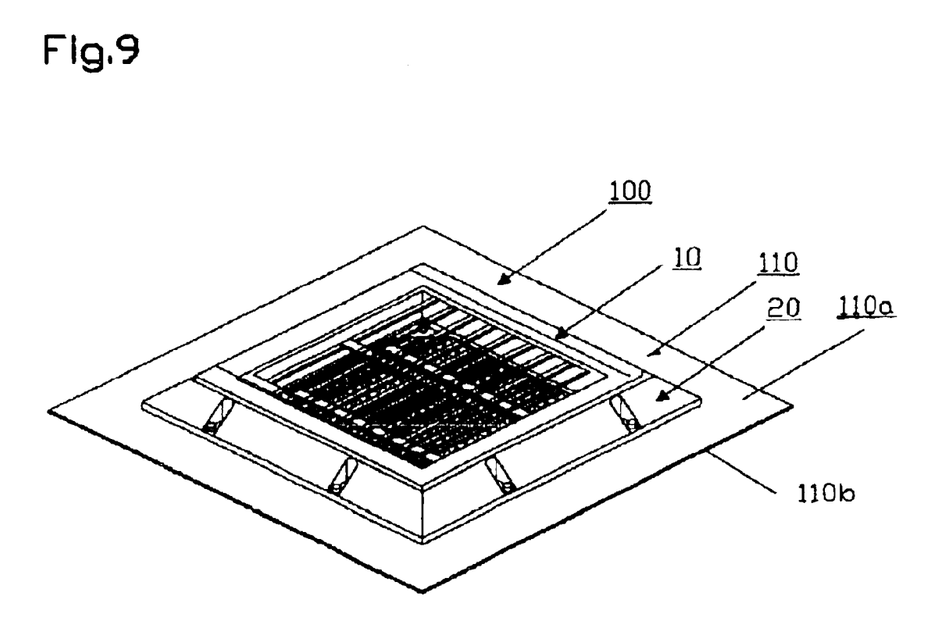
FIG. 9 shows a graphic view of a section of a switch cabinet wall with the support member installed in the region of the installation opening and with the shielding grating and ventilation grating in place.
Figure 10:
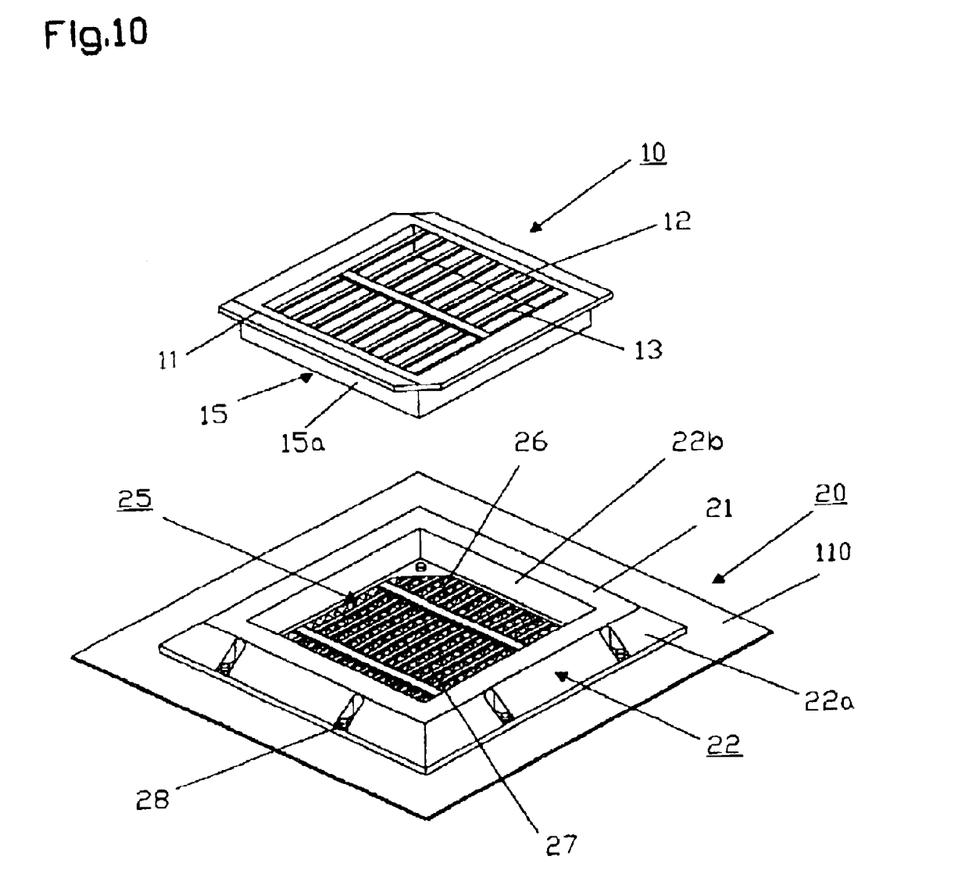
FIG. 10 shows a graphic view of a section of a switch cabinet wall with the support member installed in the region of the installation opening, with the shielding grating in place, and with the ventilation grating lifted off.

A first embodiment of an airflow unit 100 designed in accordance with the invention can be used in conjunction with a fan 50 as a filter fan (FIGS. 1 to 4) and, without a fan, as a discharge filter (FIGS. 9 and 10). The airflow unit 100 is used in housings that contain components that produce waste heat, such as switch cabinets, electronic cabinets, computer systems, or the like, in which the airflow unit 100 is installed in installation openings in a wall 110 of this type of housing (FIGS. 3 and 4). The outside surface of the wall 110 of the housing is labeled 110a, while the inside surface is labeled 110b.

Figure 1:
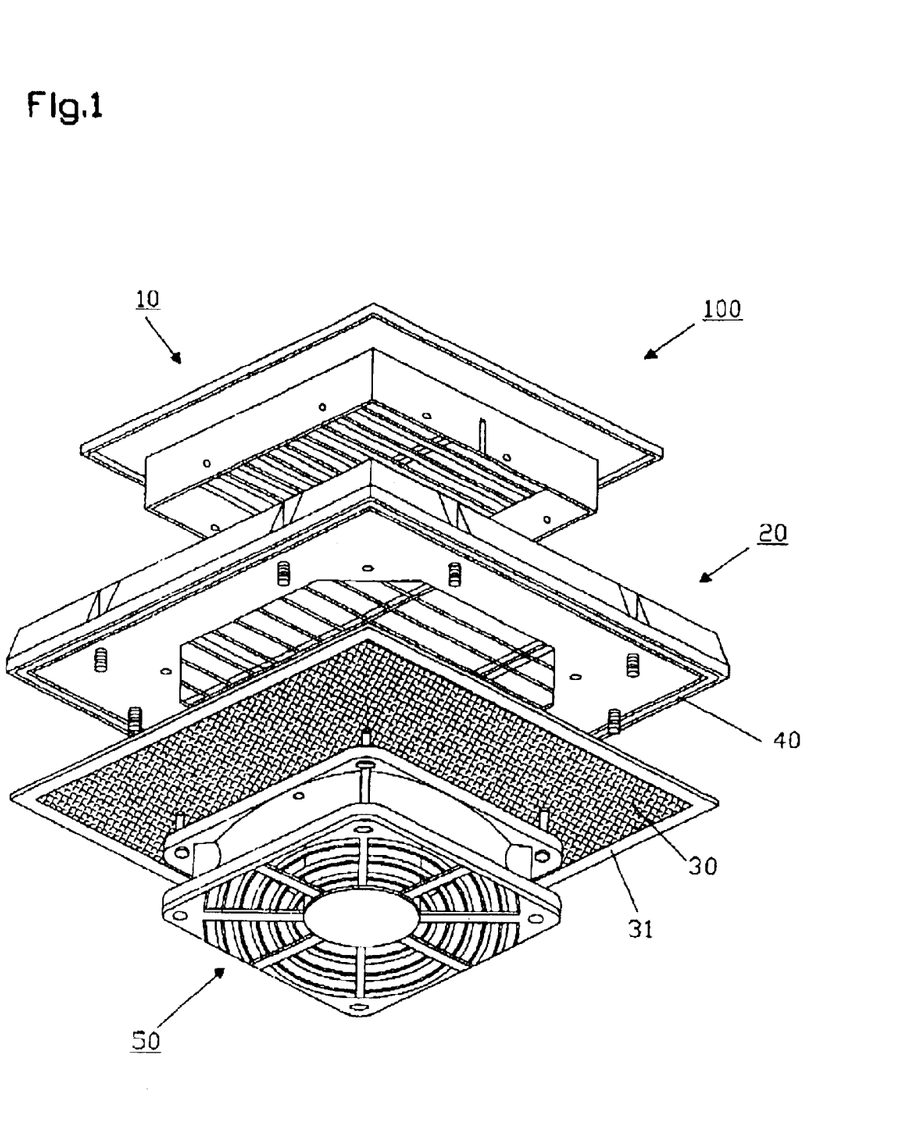
FIG. 1 shows a graphic exploded view of the airflow unit, which consists of a ventilation grating with the filter medium, a support member for the ventilation grating, a shielding grating with EMC seal, a foamed IP seal, and a fan.
Figure 8:
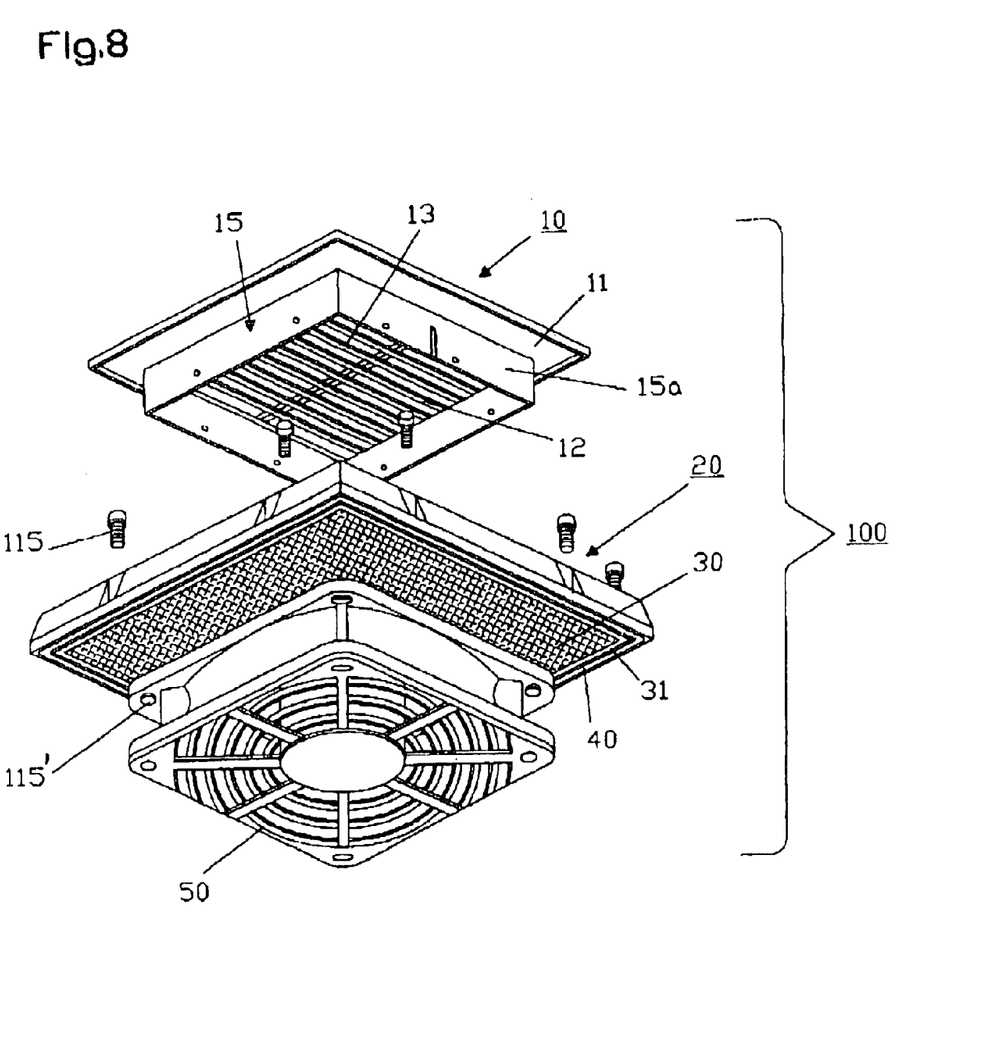
FIG. 8 shows a graphic exploded view of the airflow unit with shielding grating with EMC seal installed on the support member, with the fan installed, and with the ventilation grating lifted off.

The main components of the airflow unit 100 are a ventilation grating 10, a support member 20, a shielding grating 30 with EMC seal 31, a foamed IP seal 40, and the fan 50, if the airflow unit 100 is used as a filter fan (FIGS. 1, 2, and 8).

The ventilation grating 10 consists of a frame 11 with a front plate 12 provided with strips and/or air slits 13 and with a neck-like recessed insert 15 (FIGS. 1, 2, 3, 5 and 8), which has a peripheral wall 15a and holds a filter medium, e.g., filter mat or nonwoven filter material.

The support member 20 consists of a frame 21 with a peripheral wall 22, whose peripheral outer wall surface 22a expands towards the outside like a wedge but which may have a differently designed wall surface. The inner wall surface 22b of the peripheral wall 22 of the frame 21 bounds an inner space 25, which serves to hold the neck-like recessed insert 15 of the ventilation grating 10 (FIGS. 5, 9 and 10) with or without filter medium.

The dimensions and shape of the inner space 25 of the support member 20 are adapted to the shape and dimensions of the neck-like recessed insert 15 of the frame 11 of the ventilation grating 10 to allow the neck-like recessed insert 15 of the ventilation grating 10 to be inserted in the inner space 25 of the support member 20 (FIGS. 8 and 9).

Through-holes 28 for fastening screws or other kinds of fastening devices, such as clips that can be pushed through, are provided in the outer wall surface 22a of the peripheral wall 22 of the support member 20 (FIG. 10). Other types of fastening may also be used.

The wall surface 26 of the frame 21 of the support member 20 is provided with airflow openings 27 and with water-diverting fins or rib formations for draining splash water and condensation water that have penetrated the unit (FIG. 10), or the wall 26 is formed by water-diverting fins and airflow openings.

The support member 20 serves to hold the neck-like recessed insert 15 of the ventilation grating 10, which in turn holds the filter medium, which is not shown in the drawing.

The shielding grating 30, which is inserted from below into the frame 21 of the support member 20 or is placed against the wall plate 26 of the support member 20 from below, is provided with an EMC seal. The shielding grating 30 takes on the role of EMC damping and is inserted in the support member 20 or placed on it (FIG. 7).

Figure 7:
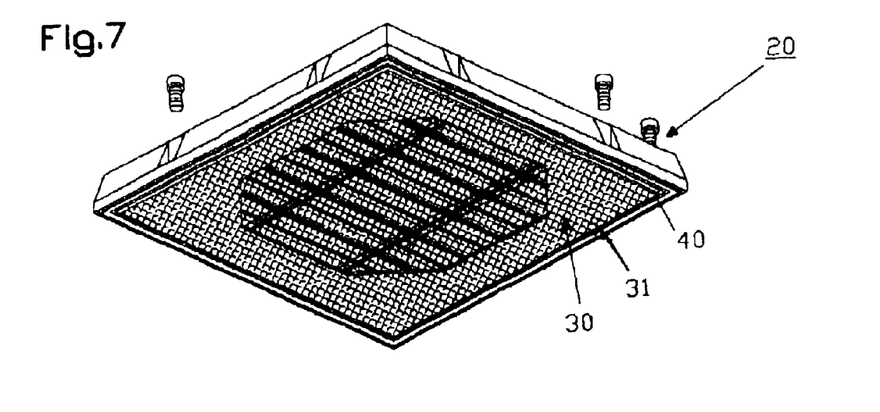
FIG. 7 shows a graphic view of the support member with the shielding grating placed on it.

To hold the shielding grating 30, the peripheral wall 22 of the frame 21 is designed to project towards the wall surface 26, so that the inserted shielding grating 30 with its EMC seal 31 is laterally enclosed and held by this projecting wall section (FIG. 7). To prevent the shielding grating 30 from falling out of the support member 20, the shielding grating is secured by suitable means of fastening, such as screwing or riveting, but other types of fastening may also be used, such as clamping or locking devices (FIG. 8). The peripheral edge of the support member 20 can be provided with a peripheral groove, in which the foam 40 is placed.

The shielding grating 30 is inserted in the support member 20 on the side facing away from the ventilation grating 10. The screws 115' that hold the fan 50 on the support member 30 also fasten the shielding grating 30 (FIG. 8). The fan 50 may also be fastened, for example, by riveting. The complete fastening to the housing wall 110 is accomplished with screws 115.

To achieve good contact with the sheet metal of the housing of a switch cabinet, a simple EMC seal, e.g., a clip-on seal, is pushed onto the sides of the shielding grating 30 during production or otherwise brought into contact with the edges of the shielding grating 30. Both self-adhesive and non-self-adhesive seals may be used. For example, the seal preferably could be mounted by a clamping connection. In this regard, the customer will have to remove a strip of enameling from the switch cabinet around the installation opening or cutout 111, e.g., by sanding.

In addition, protection from splash water and spray water is provided by a foamed IP seal 40, which is used especially to achieve high IP protection. The IP seal 40 is preferably inserted in a groove provided for this purpose (FIGS. 3, 4, and 8).

The fan 50 can be directly joined with the ventilation grating 10, the support member 20, and the shielding grating 30 (FIG. 8).

The components 10, 20, 30, 40, and 50 of the airflow unit 100 are fastened to the wall 110 of the housing of a switch cabinet from the outside by screws or other fastening devices (FIG. 3).

In accordance with another embodiment, the airflow unit 100 with the ventilation grating 10 and the support member 20 can be installed on the outside wall surface 110a of the wall 110 of the housing, and the shielding grating 30 with the fan 50 can be installed on the inside wall surface 110b of the wall 110 of the housing.

Figure 11:
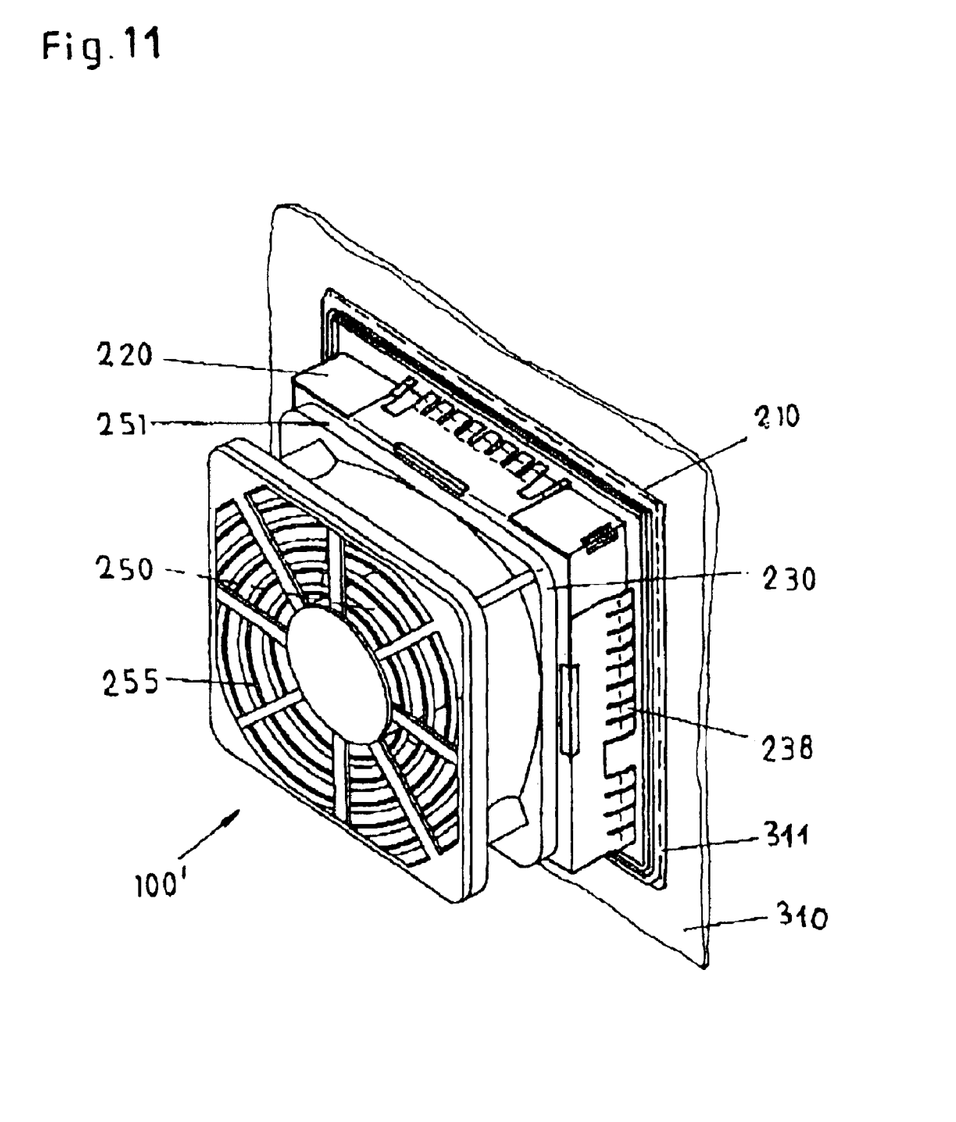
FIG. 11 shows a graphic view, from the fan side, of another embodiment of a airflow unit, which consists of a design cover with the filter medium, a housing for the design cover, an EMC shielding plate, and a fan housing with a fan and a protective safety grille.

Another embodiment provides for an airflow unit 100', which can be used as a filter fan in conjunction with a fan 250 and as a discharge filter without a fan. The airflow unit 100' is used in housings that contain components that produce waste heat, such as switch cabinets, electronics cabinets, computer systems, or the like, such that the airflow unit 100' is installed in installation openings 311 in a wall 310 of a housing of this type (FIG. 11).

The main components of the airflow unit 100' are more or less the same as those of the airflow unit 100 and comprise a design cover 210, a base housing 220, an EMC shielding plate, and the fan 250, if the airflow unit 100' is to be used as a filter fan (FIGS. 11, 12, 15, and 16).

Figure 15:
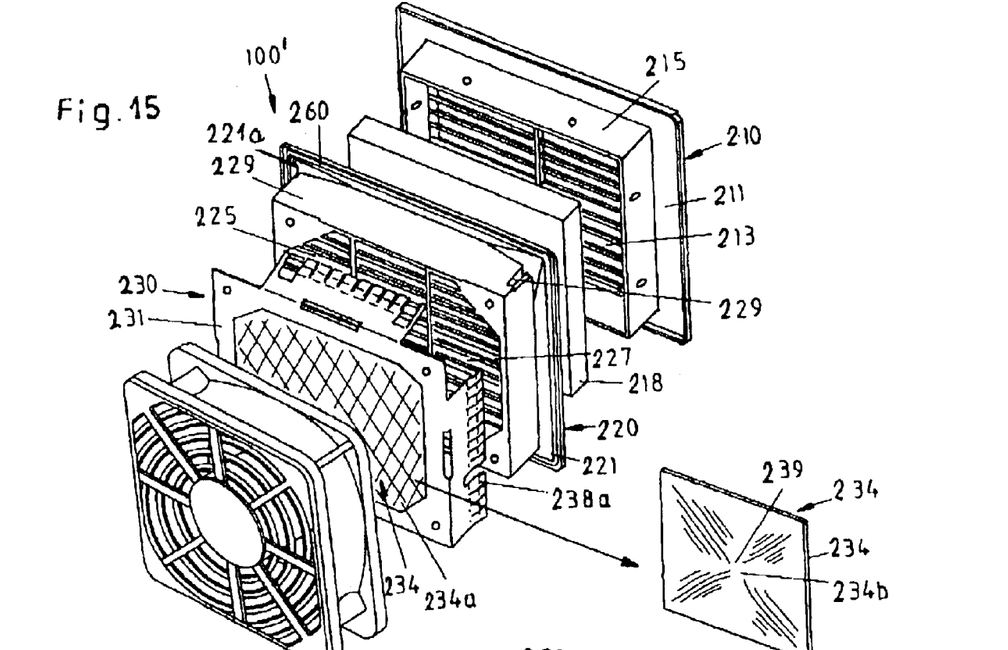
FIG. 15 shows a graphic exploded view of the individual components of the airflow unit from the fan side.
Figure 16:
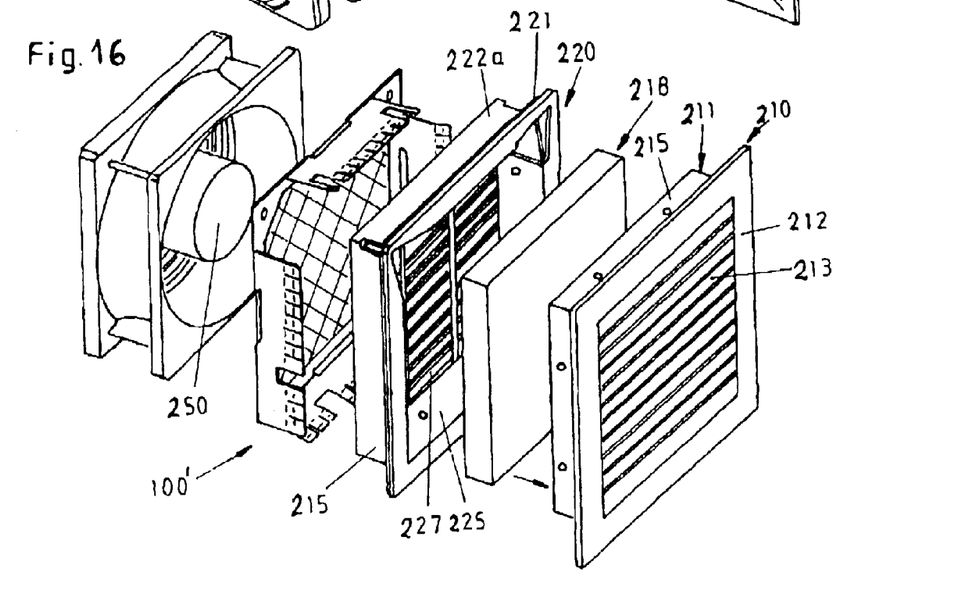
FIG. 16 shows a graphic exploded view of the individual components of the airflow unit from the design cover side.

The design cover 210 consists of a frame 211 with a front plate 212 provided with strips and/or air slits 213 and a neck-like recessed insert 215 (FIGS. 15 and 16).

Figure 12:
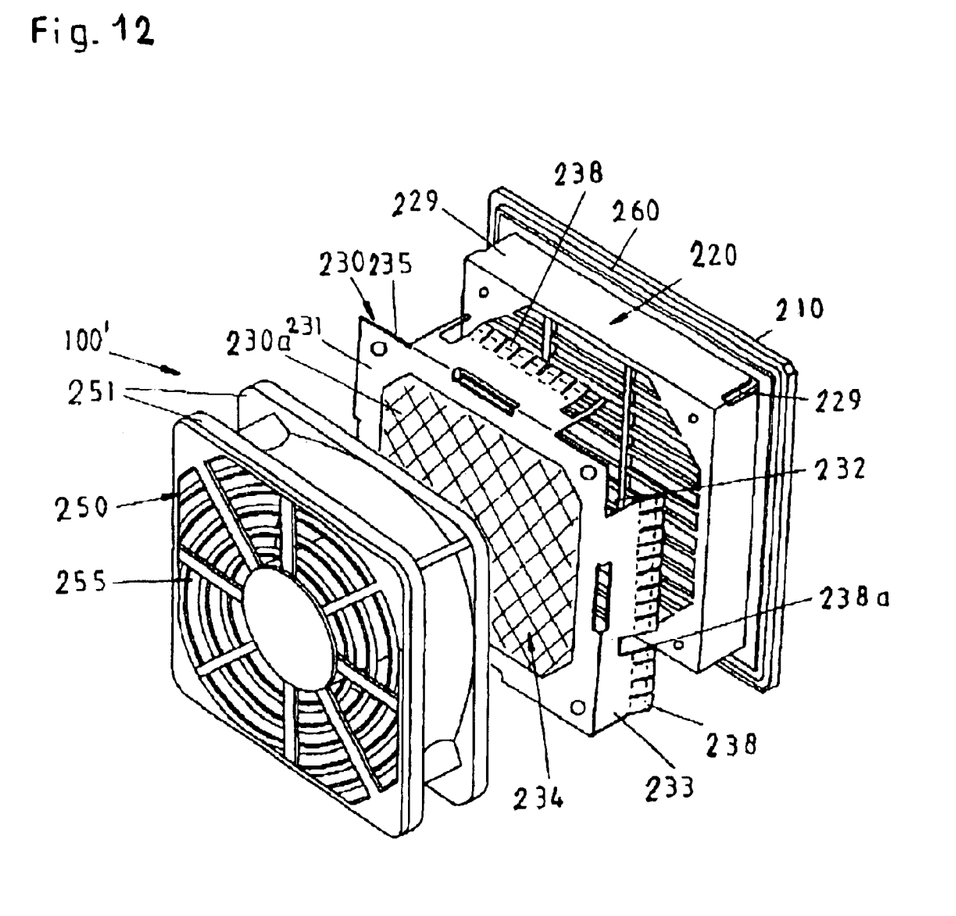
FIG. 12 shows a graphic exploded view of the airflow unit of FIG. 11 with the housing placed on the design cover.

The space formed by the neck-like recessed insert 215 of the design cover 210 serves to hold a space-filling filter medium 218, which is inserted in the space bounded by the frame 211 (FIG. 12).

The base housing 220 likewise consists of a frame 221 with a peripheral sidewall 222a and with an interior space 225 for holding the neck-like recessed insert 215 of the design cover 210, so that the design cover 210 can be inserted with its neck-like recessed insert 215 into the interior space 225 of the frame 221 of the base housing 220, with which it is locked. The base housing 220 is provided with airflow openings 227 on its side that faces away from the design cover 210 and forms the rear wall and with a peripheral seal 260, e.g., an IP seal, on its side facing the design cover 210. This seal 260 is installed on the base housing 220 on the side of the projecting peripheral edge 221a of the base housing 220 that faces away from the design cover 210. The seal 260 may be integrated in the base housing material, but it is also possible to form a peripheral groove in the area of the peripheral edge 221 of the base housing 220 and to insert the seal 260 in this groove.

Figure 13:
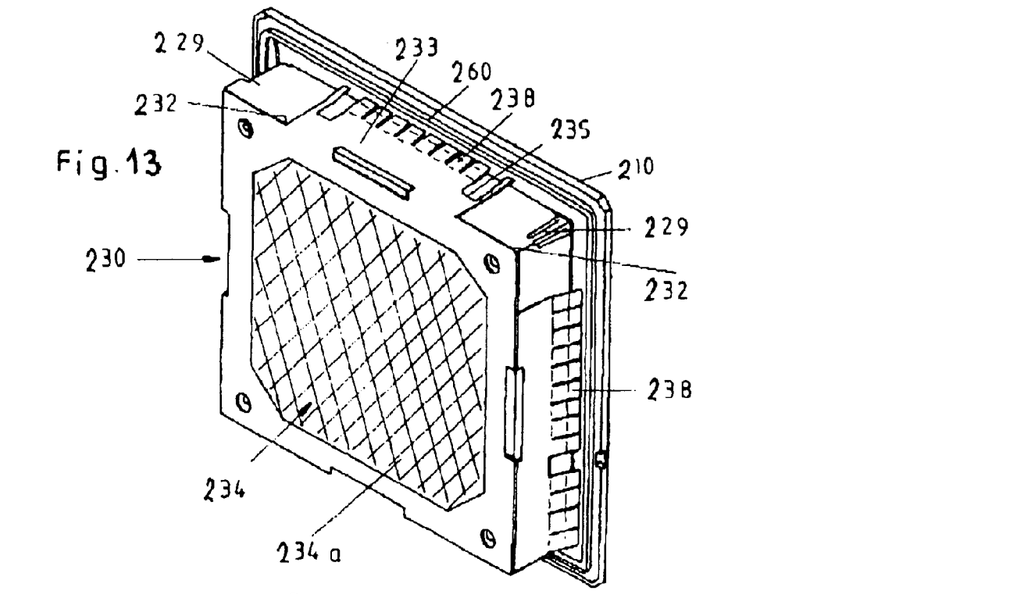
FIG. 13 shows a graphic view of the airflow unit with the fan housing detached.
Figure 14:
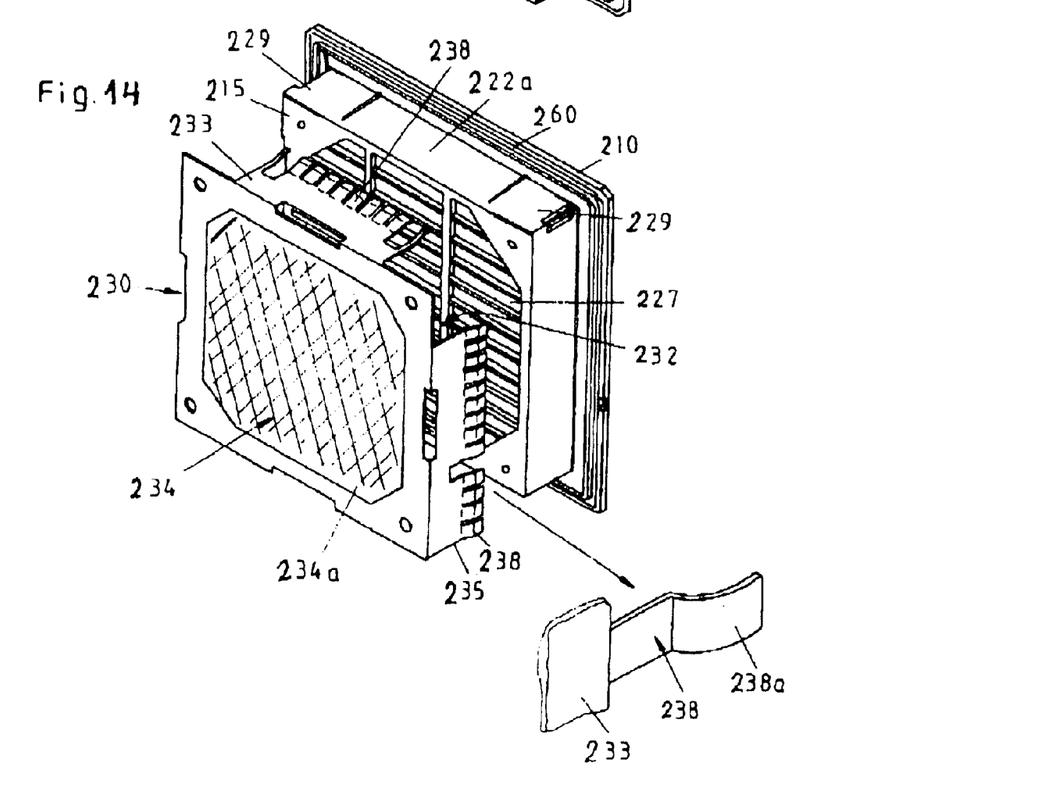
FIG. 14 shows a graphic exploded view of the airflow unit of FIG. 13, but with the EMC shielding grating detached.

Furthermore, the base housing 220 has at least two locking corners 229, by means of which a quick installation of the airflow unit 210 in the installation opening 311 in the wall 310, e.g., of a switch cabinet, can be effected. However, differently designed mounting devices may also be used (FIGS. 13 and 14).

In addition, the airflow unit 100' comprises an EMC shielding plate 230, which of a metal frame 231 with a peripheral sidewall 233, whose corner regions have recesses 232 for the locking corners 229 of the base housing 220, and with a rear wall 234a designed as a shielding grating 234, such that the lateral edges 235 of the peripheral sidewall 233 of the metal frame 231 which face the base housing 220 have a number of spring contact tongues 238 for producing an electrically conductive connection between the EMC shielding plate 230 and the installation opening 311 of a switch cabinet (FIGS. 11 and 12). These metallic spring contact tongues 238 have end sections 238a that are laterally turned out from the plane formed by the peripheral sidewall 233 of the metal frame 231 (FIG. 14). These contact tongues 238 are, for example, mounted on the metal frame 231 or are cut out of the peripheral sidewall 233 of the metal frame 231 and bent in such a way that strips shaped like contact tongues are obtained (FIG. 12). All of the components of the airflow unit 100' are held together by clamping or screw connections. To install the airflow unit 100' in the area of the installation opening 311, the base housing 220 is placed with its sidewalls 222a on the outside wall surface of the wall of the switch cabinet and preferably detachably connected to it.

A fan housing 251 with the fan 250 is joined with the design cover 210, the base housing 220 and the EMC shielding plate 230, and the fan housing 251 may also be joined with a protective safety grille 255 on the outside (FIGS. 11 and 12).

The components 210, 220, 230, 250, and 251 of the airflow unit 100' are mounted on the design cover 210 by screws or fastening devices of a different design.

Except for the EMC shielding plate 230, all of the components 210, 220, 251 of the airflow unit 100' are made of a plastic. However, these components may also be made of other materials.

The shielding grating 234 of the EMC shielding plate 230 may be provided with surfaces running at an inclination from the peripheral edge 234a of the shielding grating 234 to the center 234b of the shielding grating 234 to form a central depression 239 (FIG. 15).

What is claimed is:

1. Airflow unit, especially a filter fan or discharge filter with or without a fan (50) for installation in an installation opening (111) in a wall (110), of a housing that contains components that produce waste heat wherein the airflow unit (100) comprises
   a ventilation grating (10), which consists of a frame (11) with a front plate (12) provided with strips and/or air slits (13) and a neck-like recessed insert (15), wherein the frame (11) holds a filter medium,
   a support member (20), which consists of a frame (21) with a peripheral wall surface (22a) that preferably expands outwardly wedge-like and with an interior space (25) for holding the neck-like recessed insert (15) of the ventilation grating (10), such that the support member (20), on its side facing away from the ventilation grating (10), is provided with airflow openings (27) and with water-diverting fins or rib formations for draining splash water and condensation water that have penetrated the unit, and serves to hold the neck-like recessed insert (15) of the ventilation grating (10),
   a shielding grating (30) with an EMC seal (31) for EMC damping, which is inserted in the support member (20) on the side facing away from the ventilation grating (10) and is held on the support member (20) by means of screw, rivet, adhesive, or clamp connections, and
   an IP seal (40) foamed onto the support member (20) for protection against splash water and spray water, such that all components of the airflow unit (100) are held together by clamp or screw connections, and wherein, to install the airflow unit (100) in the region of the installation opening (111) in the wall surface (22a) of the housing, the airflow unit (100) is placed on the outer wall surface (110a) of the wall (110) of the housing and is detachably connected with the housing wall (110).

2. Airflow unit, especially a filter fan or discharge filter with or without a fan (50) for installation in an installation opening in a wall (110) especially a wall of a housing that contains components that produce waste heat, wherein the airflow unit (100') comprises
   a design cover (210), which consists of a frame (211) with a front plate (212) provided with strips and/or air slits (213) and with a neck-like recessed insert (215),
   a space-filling filter medium (218), which is inserted in the space bounded by the frame (211),
   a base housing (220), which consists of a frame (221) with a peripheral sidewall (222a) and with an interior space (225) for holding the neck-like recessed insert (215) of the design cover (210), such that the base housing (220) is provided with airflow openings (227) on its side that faces away from the design cover (210) and that forms the rear wall and with a peripheral seal (260) on its side facing the design cover (210) and has at least two locking corners (229).
   an EMC shielding plate (230), which consists of a metal frame (231) with a peripheral sidewall (233), whose corner regions have recesses (232) for the locking corners (229) of the base housing (220), and with a rear wall (234a) designed as a shielding grating (234), such that the lateral edges (235) of the peripheral sidewall (233) of the metal frame (231) which face the base housing (220) have a number of spring contact tongues (238) for producing an electrically conductive connection between the EMC shielding plate (230) and the installation opening (211) of a switch cabinet, which spring contact tongues have end sections (238a) that are laterally turned out from the plane formed by the peripheral sidewall (233) of the metal frame (231), such that the contact tongues (238) are fastened by spot welding to the metal frame (231) or are cut out of the peripheral sidewall (233) of the metal frame (231), such that all of the components of the airflow unit (100') are held together by clamping or screw connections, and wherein, to install the airflow unit (100') in the area of the installation opening (311), the sidewalls (222a) of the base housing (220) of the airflow unit (100') are placed on the outside wall surface of the wall (310) of the switch cabinet and detachably connected therewith.

3. Airflow unit in accordance with claim 1, wherein a fan (50) is joined with the ventilation grating (10), the support member (20), and the shielding grating (30).

4. Airflow unit in accordance with claim 2, wherein a fan housing (251) with a fan (250) and with an outer protective safety grille (255) is joined with the design cover (210), the base housing (220), and the EMC shielding plate (230).

5. Airflow unit in accordance with claim 1, wherein the airflow unit (100) with the ventilation grating (10) and the support member (20) is installed on the outside wall surface (110a) of the wall (110) of the housing, and the shielding grating (30) with the fan (50) is installed on the inside wall surface (110b) of the wall (110) of the housing.

6. Airflow unit in accordance with claim 1, wherein the components (10, 20, 30, 40, 50) of the airflow unit (100) are mounted on the wall (110) of the housing by screws or fastening devices of a different design.

7. Airflow unit in accordance with any claim 1, wherein an EMC seal, or a differently formed material is used to improve the contact between the shielding grating (30) and the sheet-metal wall (110) of the housing.

8. Airflow unit in accordance with claim 2, wherein the components (210, 220, 230, 250) of the airflow unit (100') are mounted on the design cover (210) by screws or fastening devices of a different design.

9. Airflow unit in accordance with any claim 2, wherein all of the components (210, 220, 251) of the airflow unit (100') are made of a plastic, except for the EMC shielding plate (230).

10. Airflow unit in accordance with claim 2, wherein an adapter-like fan support is installed between the fan housing (251) with the fan (250) and the other components (210, 220, 230) of the airflow unit (100') for mounting fan housings with larger or smaller dimensions relative to the components (210, 220, 230) of the airflow unit (100').

11. Airflow unit in accordance with claim 2, wherein the seal (260) is installed on the base housing (220) on the side of the projecting peripheral edge (221a) of the base housing (220) that faces away from the design cover (210) and is integrated in the base housing material or is inserted in a peripheral groove.

12. Airflow unit in accordance with a claim 2, wherein the shielding grating (234) of the EMC shielding plate (230) is provided with surfaces running at an inclination from the peripheral edge (234a) of the shielding grating (234) to the center (234b) of the shielding grating (234) to form a central depression (239).

13. The airflow unit according to claims 1 or 2, wherein the components that produce waste heat are a switch cabinet, an electronics cabinet, or a computer system.

14. The airflow unit according to claim 7, wherein the EMC seal is a clip-on seal.

* * * * *